(12) United States Patent
Ollitrault et al.

(10) Patent No.: US 10,649,040 B2
(45) Date of Patent: May 12, 2020

(54) LEAKAGE CURRENT DETERMINATION

(71) Applicant: NXP USA, Inc., Austin, TX (US)

(72) Inventors: Stephan Ollitrault, Toulouse (FR); Savino Luigi Lupo, Munich (DE)

(73) Assignee: NXP USA, Inc., Austin, TX (US)

( * ) Notice: Subject to any disclaimer, the term of this patent is extended or adjusted under 35 U.S.C. 154(b) by 186 days.

(21) Appl. No.: 15/659,286

(22) Filed: Jul. 25, 2017

(65) Prior Publication Data
US 2018/0149689 A1   May 31, 2018

(30) Foreign Application Priority Data

Nov. 28, 2016 (EP) ...................................... 16306566

(51) Int. Cl.
| | |
|---|---|
| H02J 7/00 | (2006.01) |
| H02J 7/14 | (2006.01) |
| G01R 31/50 | (2020.01) |
| G01R 31/396 | (2019.01) |
| G01R 19/257 | (2006.01) |
| G01R 31/08 | (2020.01) |
| G01R 31/30 | (2006.01) |

(52) U.S. Cl.
CPC ........... *G01R 31/50* (2020.01); *G01R 19/257* (2013.01); *G01R 31/08* (2013.01); *G01R 31/3008* (2013.01); *G01R 31/396* (2019.01); *H02J 7/0016* (2013.01); *H02J 7/0026* (2013.01); *Y02T 10/7055* (2013.01)

(58) Field of Classification Search
USPC ....................................................... 320/118
See application file for complete search history.

(56) References Cited

U.S. PATENT DOCUMENTS

| | | | | |
|---|---|---|---|---|
| 5,834,925 A | * | 11/1998 | Chesavage | .............. H02J 1/108 323/272 |
| 9,194,904 B2 | | 11/2015 | Wang et al. | |
| 2010/0259276 A1 | | 10/2010 | Streit | |
| 2013/0335095 A1 | * | 12/2013 | Kiuchi | .................. H01M 10/48 324/426 |

(Continued)

FOREIGN PATENT DOCUMENTS

| | | |
|---|---|---|
| EP | 2770606 A1 | 8/2014 |
| EP | 2919029 A1 | 9/2015 |

*Primary Examiner* — Alexis B Pacheco (57) ABSTRACT

An apparatus for determining the occurrence of a leakage current between a series connected electrochemical battery cells, comprising:
a first cell connection terminal for connection to a first cell's first terminal via first filter circuitry;
a second cell connection terminal for connection, via second filter circuitry, to a connection between the first cell's second terminal and a second cell's first terminal, the first and second cell adjacent in the series arrangement;
a first cell balancing terminal for connection to the first cell's first terminal bypassing the first filter circuitry;
a second cell balancing terminal for connection to the connection between the first cell's second terminal and the second cell's first cell terminal;
balancing circuitry for providing a connection between the cell balancing terminals;
the apparatus configured to provide for identification of a leakage current based at least on a voltage between the cell connection terminals and the cell balancing terminals.

20 Claims, 9 Drawing Sheets

(56) References Cited

U.S. PATENT DOCUMENTS

| | | | |
|---|---|---|---|
| 2014/0111160 A1* | 4/2014 | Nozawa | G01R 31/007 |
| | | | 320/118 |
| 2015/0162759 A1* | 6/2015 | Fujii | H01M 10/425 |
| | | | 320/118 |
| 2015/0260799 A1* | 9/2015 | Kuroda | H01M 10/4285 |
| | | | 324/434 |
| 2015/0346257 A1 | 12/2015 | Tabatowski-Bush | |
| 2016/0172717 A1* | 6/2016 | Nakatsuka | B60L 58/18 |
| | | | 320/112 |
| 2017/0160761 A1* | 6/2017 | Chan | G05B 19/106 |
| 2017/0254854 A1* | 9/2017 | Honda | G01R 31/3644 |
| 2019/0047438 A1* | 2/2019 | Jaster | G01R 31/396 |

* cited by examiner

500 providing for identification of a leakage current based on one or more of;
i) a voltage difference between a filtered signal, filtered by first filter circuitry, from the first cell terminal and an unfiltered signal from the first cell terminal that bypasses the first filter circuitry; and ii) a voltage difference between a filtered signal, filtered by second filter circuitry, from the second cell terminal and an unfiltered signal from the second cell terminal that bypasses the second filter circuitry;
wherein the unfiltered signals are obtained from connections to balancing circuitry for selectively providing a cell balancing connection between the first cell terminal and the second cell terminal.

LEAKAGE CURRENT DETERMINATION

BACKGROUND

Field

The present disclosure relates to an apparatus for determining the occurrence of a leakage current.

Related Art

The accurate measurement of the voltage across battery cells in a series arrangement may be important. The measurement may be affected by a leakage current. The reliable identification of the occurrence of a leakage current may be important.

SUMMARY

According to a first aspect of the present disclosure there is provided an apparatus for determining the occurrence of a leakage current between a plurality of electrochemical battery cells connected in a series arrangement, each cell having a first cell terminal and a second cell terminal, wherein the apparatus comprises:
 a first cell connection terminal for connection to the first cell terminal of a first cell via first filter circuitry;
 a second cell connection terminal for connection, via second filter circuitry, to a first node on a connection between a second cell terminal of the first cell and a first cell terminal of a second cell, the first cell and the second cell adjacent to one another in the series arrangement;
 a first cell balancing terminal for connection to the first cell terminal of the first cell and bypassing the first filter circuitry;
 a second cell balancing terminal for connection to a second node on the connection between the second cell terminal of the first cell and the first cell terminal of the second cell;
 balancing circuitry for selectively providing a cell balancing connection between the first cell balancing terminal and the second cell balancing terminal;
 the apparatus configured to provide for identification of a leakage current based at least on a voltage difference between one or more of;
  i) the first cell connection terminal and the first cell balancing terminal; and
  ii) the second cell connection terminal and the second cell balancing terminal.

In one or more embodiments the apparatus includes difference determination circuitry configured to provide for identification of the leakage current based at least on a leak detection voltage difference comprising the difference between the voltages measured between;
 i) the first cell connection terminal and the first cell balancing terminal; and
 ii) the second cell connection terminal and the second cell balancing terminal.

In one or more embodiments the apparatus provides for identification of leakage current based on a filtered leak detection voltage difference and based on a predetermined threshold, the filtered leak detection voltage difference comprising the leak detection voltage difference subjected to discrete-time filtering. In one or more examples, a sliding window average may be applied to obtain the filtered leak detection voltage difference.

In one or more embodiments, the difference determination circuitry is provided by a differential analogue to digital converter having a positive terminal and a negative terminal, the positive terminal connectable to at least the first cell connection terminal and the negative terminal connectable to at least the first cell balancing terminal.

In one or more embodiments, the difference determination circuitry includes a cross connect network;
 configured to sequentially form connections between the positive terminal of the differential analogue to digital converter and at least two of the first cell connection terminal; the second cell connection terminal; the first cell balancing terminal and the second cell balancing terminal; and
 configured to sequentially form connections between the negative terminal of the differential analogue to digital converter and at least two of the first cell connection terminal; the second cell connection terminal; the first cell balancing terminal and the second cell balancing terminal.

In one or more embodiments, the difference determination circuitry includes a calculation block configured to receive signalling from the differential analogue to digital converter representative of voltage difference measurements and determine the difference between the voltages measured between;
 i) the first cell connection terminal and the first cell balancing terminal; and
 ii) the second cell connection terminal and the second cell balancing terminal.

In one or more examples the calculation block is configured to remove a voltage offset component from the signalling received from the differential analogue to digital converter. In one or more examples the calculation block is configured to modify said signalling received from the differential analogue to digital converter based on a predetermined gain correction value.

In one or more embodiments, the apparatus includes a transceiver configured to pass said identification of a leakage current to a supervisory block external to the apparatus.

In one or more examples, the supervisory block forms part of the apparatus and the supervisory block is configured to, in response to said identification of a leakage current, provide for disconnection of the series arrangement from one or more of:
 a load powered, at least in part, by said series arrangement; and
 a charger configured to charge said electrochemical cells of the series arrangement.

In one or more embodiments, the leakage current comprises one or more of:
 i) a leakage current between the first cell connection terminal and the second cell connection terminal;
 ii) a leakage current through a differential filtering capacitor connected between the first cell connection terminal and the second cell connection terminal;
 iii) a leakage current through the first filter circuitry or second filter circuitry;
 iv) a leakage current through the balancing circuitry when said circuitry is open and thereby not providing said cell balancing connection.

In one or more embodiments, the apparatus is configured to provide for cell voltage monitoring based on voltages measured from the first cell connection terminal and the second cell connection terminal.

In one or more embodiments, the apparatus configured to provide for identification of a leakage current during charging or discharging of the electrochemical battery cells of the series arrangement.

In one or more embodiments, the first filter circuitry and the second filter circuitry comprise low pass filters. In one or more examples, the first filter circuitry and the second filter circuitry comprise anti-aliasing low pass filters.

According to a second aspect of the present disclosure there is provided a combination comprising the apparatus of the first aspect in combination with cell connection circuitry, the cell connection circuitry including the first filter circuitry and the second filter circuitry.

In one or more embodiments, the cell connection circuitry includes one or more of;
  i) a first balancing resistor ($R_{BAL}$) for control of current through the cell balancing connection, the first balancing resistor provided in the connection between the first cell balancing terminal and the first cell terminal of the first cell; and
  ii) a second balancing resistor ($R_{BAL\_C}$) for control of current through the cell balancing connection, the second balancing resistor provided in the connection between the second cell balancing terminal and the second node.

In one or more examples, each cell balancing terminal provides for connection to the respective cell terminal via balancing filter circuitry. In one or more examples, the first balancing resistor is connected in parallel with a first balancing capacitor to provide for said balancing filter circuitry. In one or more examples, the second balancing resistor is connected in parallel with a second balancing capacitor to provide for said balancing filter circuitry.

In one or more examples, the cell connection circuitry includes one or more of;
  i) a first capacitor ($C_{HF}$) for receiving charge in the event of an electrostatic discharge, the first capacitor connected between a reference voltage and a node between the first balancing resistor and the first cell terminal of the first cell; and
  ii) a second capacitor ($C_{HF}$) for receiving charge in the event of an electrostatic discharge, the second capacitor connected between a reference voltage and a node between the second balancing resistor and the second node.

In one or more examples, the first node and the second node are the same node.

In one or more examples, the apparatus is configured to, in a first mode, provide for determination of the voltage between the first cell connection terminal and the second cell connection terminal to thereby measure the voltage of the battery cell to which the terminals are connected and, in a second mode, provide for determination of the occurrence of the leakage current.

In one or more examples, the apparatus includes second balancing circuitry for selectively providing a cell balancing connection, for the second cell, between the second balancing terminal and a third cell balancing terminal, the third cell balancing terminal for connection to a third node on the connection between the second cell terminal of the second cell and the first cell terminal of a third cell, the second cell and the third cell adjacent to one another in the series arrangement.

In one or more examples, one or more of the balancing circuitry and the second balancing circuitry comprises a balancing switch, such as a MOSFET, the balancing switch configured to selectively provide a short circuit between the respective balancing terminals in response to a cell balancing control signal.

According to a third aspect of the present disclosure there is provided a method comprising providing for determination of an occurrence of a leakage current between a plurality of electrochemical battery cells connected in a series arrangement, each cell having a first cell terminal and a second cell terminal, wherein the method comprises;
  providing for identification of a leakage current based on one or more of;
    i) a voltage difference between a filtered signal, filtered by first filter circuitry, from the first cell terminal and an unfiltered signal from the first cell terminal that bypasses the first filter circuitry; and
    ii) a voltage difference between a filtered signal, filtered by second filter circuitry, from the second cell terminal and an unfiltered signal from the second cell terminal that bypasses the second filter circuitry;
  wherein the unfiltered signals are obtained from connections to balancing circuitry for selectively providing a cell balancing connection between the first cell terminal and the second cell terminal.

According to a fourth aspect of the present disclosure there is provided a battery pack comprising a plurality of electrochemical battery cells and including the apparatus of the first aspect, the electrochemical battery cells at least in part arranged in the series arrangement and comprising at least the first cell and the second cell.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

In one or more examples, for battery packs comprising a plurality of battery cells interconnected together it may be desirable to monitor the voltage across each of the cells as well as monitor the battery pack for fault conditions. Fault conditions may be due to current leakage from one or more of the battery cell terminals, circuitry connected thereto and circuitry configured to monitor the voltage across each of the battery cells. For example, a large battery pack may comprise many battery cells, which may be interconnected in series in order to achieve high voltage. In some examples, the performance of each battery cell and the detection of a fault may be important.

Figure 1:
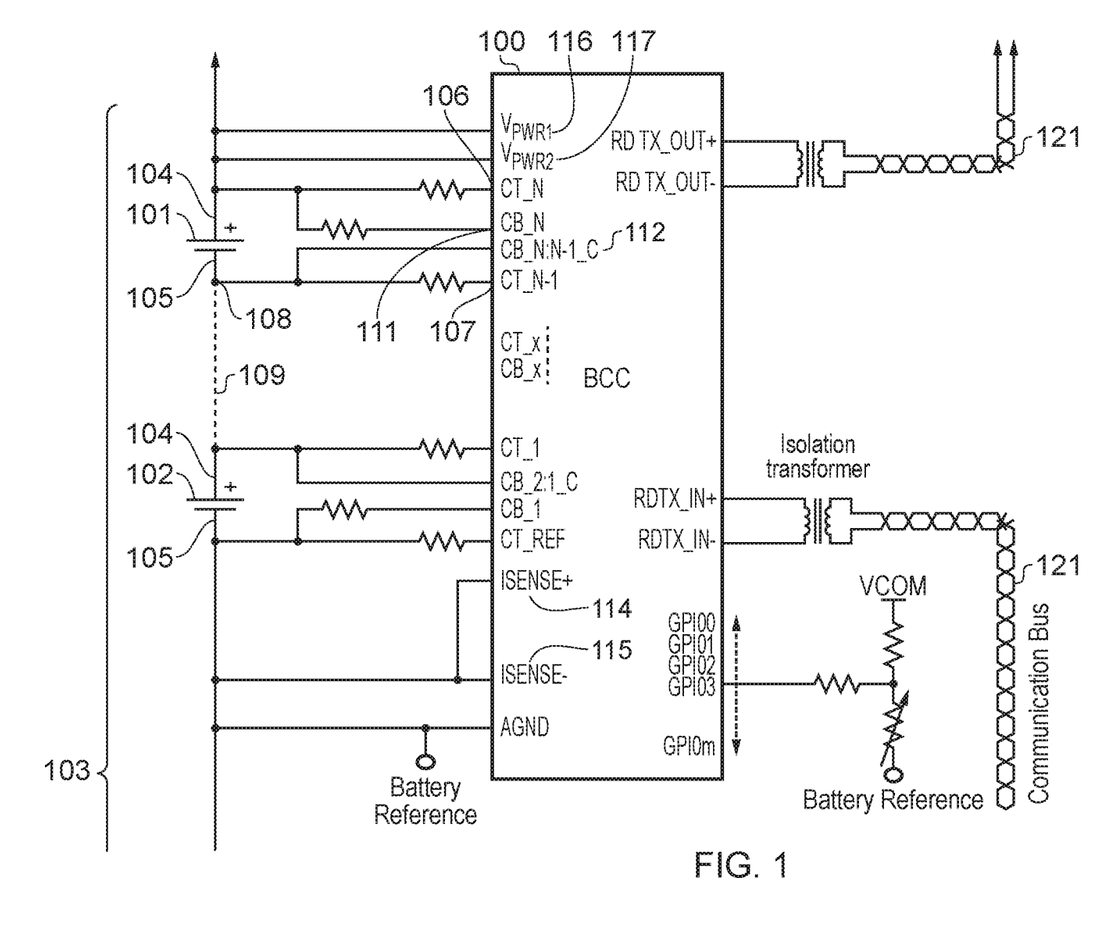
FIG. 1 shows a first example embodiment of an apparatus and a series arrangement comprising a plurality of electrochemical battery cells.
Figure 2:
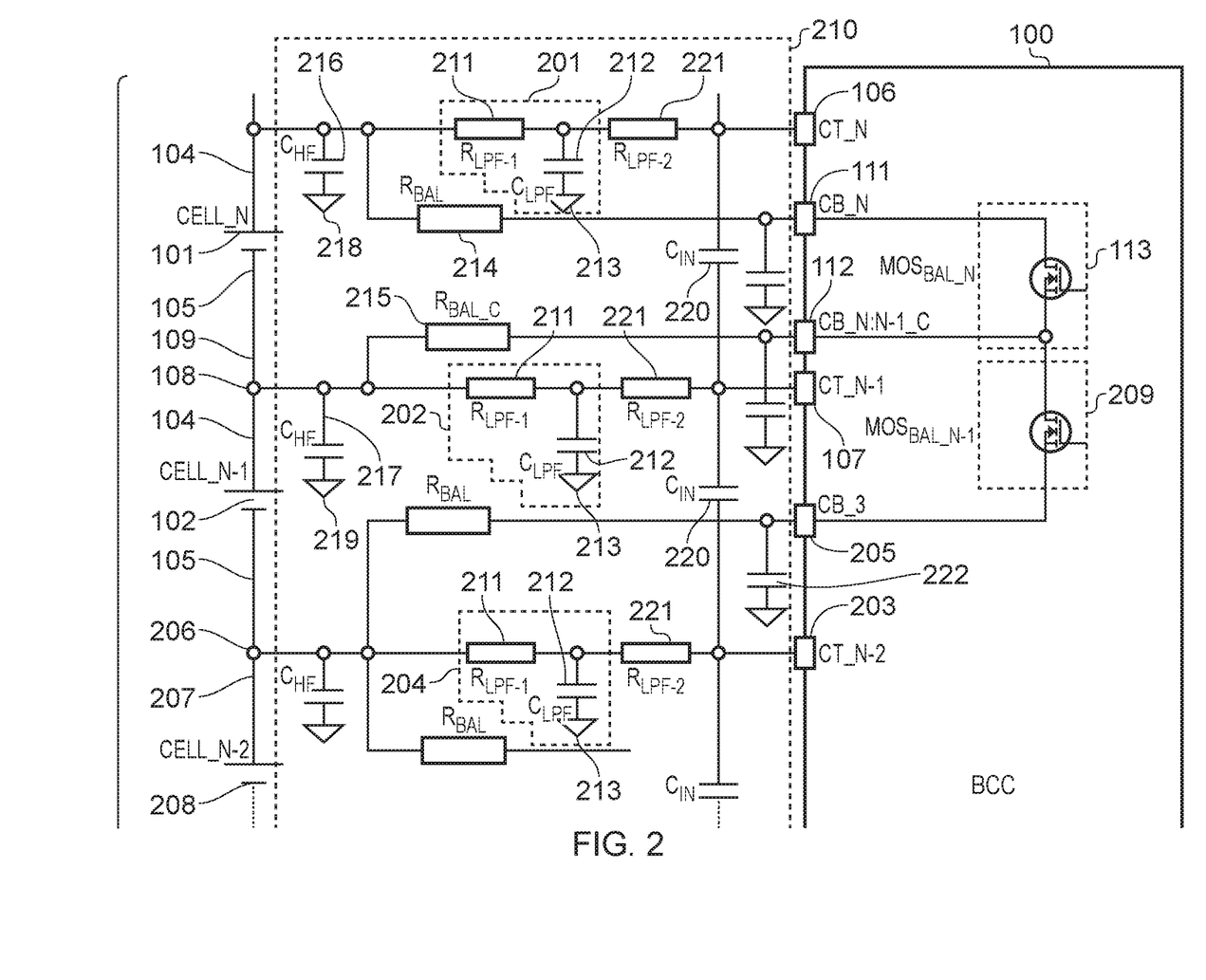
FIG. 2 shows a second example embodiment of an apparatus similar to that shown in FIG. 1.

FIGS. 1 and 2 show an example apparatus 100 for determining the occurrence of a leakage current between a plurality of electrochemical battery cells 101, 102 connected in a series arrangement 103, each cell 101, 102 having a first cell terminal 104 and a second cell terminal 105.

With reference primarily to FIG. 2, the apparatus 100 comprises a first cell connection terminal 106 for connection to the first cell terminal 104 of a first cell 101 via first filter circuitry 201. The apparatus 100 further comprises a second cell connection terminal 107 for connection, via second filter circuitry 202, to a first node 108 on a connection 109 between the second cell terminal 105 of the first cell 101 and a first cell terminal 104 of a second cell 102, the first cell 101 and the second cell 102 directly adjacent to one another in the series arrangement 103. The example apparatus 100 further includes a first cell balancing terminal 111 for connection to the first cell terminal 104 of the first cell 101 and bypassing the first filter circuitry 201. The example apparatus 100 includes a second cell balancing terminal 112 for connection to a second node 108 on the connection 109 between the second cell terminal 105 of the first cell 101 and the first cell terminal 104 of the second cell 102. In one or more examples, the first node and the second node comprise the same node, labelled 108. The apparatus 100 further comprises balancing circuitry 113 for selectively providing a cell balancing connection between the first cell balancing terminal 111 and the second cell balancing terminal 112, which may provide for current flow around an individual battery cell in the series arrangement 103 of battery cells. Thus, the provision of the cell balancing connection by balancing circuitry 113 provides a current path, at least in part, to bypass battery cell 101. It will be appreciated that while the description herein will describe an example arrangement of the apparatus 100 for one of the battery cells 101, and an adjacent battery cell 102, the structure may be reproduced for some or all of the cells in the series arrangement 103.

In this example, the apparatus 100 is configured to provide for identification of a leakage current based at least on a voltage difference between one or more of;
 i) the first cell connection terminal 106 and the first cell balancing terminal 111; and
 ii) the second cell connection terminal 107 and the second cell balancing terminal 112.

In particular, in one or more examples, the apparatus 100 includes difference determination circuitry 300 (shown in FIG. 3) configured to provide for identification of a leakage current based at least on a leak detection voltage difference comprising the difference between the voltages measured between;
 i) the first cell connection terminal 106 and the first cell balancing terminal 111; and
 ii) the second cell connection terminal 107 and the second cell balancing terminal 112.

With reference to FIG. 1, the apparatus 100 may comprise a battery cell monitoring and balancing chip (BCC). The BCC may comprise an integrated circuit configured to perform measurements on a continuous, series-connected, plurality of battery cells. For example, the BCC may be configured to perform measurements on a cluster of N battery cells 101, 102, where typically $6 \leq N \leq 16$.

The apparatus 100 may provide for monitoring of the voltage across each consecutive pair of cell connection terminals 106, 107. The apparatus 100 may further provide for determination of the temperature of one or more or cells or of the cluster. For example, the apparatus 100 may provide for temperature determination of a group of M cells, where M is for example $2 \leq M \leq 8$. The apparatus 100 may provide for measurement of the electric current flowing through the series arrangement 103 of cells 101, 102 by way of current sensing terminals 114, 115. The apparatus may be configured to receive power from the series arrangement 103 by way of power terminals 116, 117.

The series arrangement 103 of cells may be provided with a plurality of BCCs (apparatuses 100) that are arranged in a daisy chain in order to supervise the (large number of) cells of the series arrangement, wherein each apparatus 100 is responsible for a continuous subset of cells of the series arrangement 103. FIG. 1 illustrates two apparatuses 100 and 120. Each of the apparatus 100, 120 are shown providing for monitoring of two or more cells of the series arrangement. The apparatuses 101, 120 may be considered daisy chained together by virtue of a communication bus 121 that extends between the apparatuses 100, 120. The daisy chain of apparatuses 100, 120 may be connected to a supervisory block 122 by the communication bus 121. The supervisory block 122 may comprise a (Battery) Pack Controller, which may include a microcontroller (MCU). The supervisory block 122 may act as a master of a communication network that utilises the communication bus 121 in which the apparatus 100 and 120 comprise slaves. The supervisory block 122 may request information from each slave 100, 120, which may be configured to answer by providing measurement results and, optionally, an indication of an occurrence of a leakage current. The supervisory block may be configured to control the balancing circuitry 113.

Furthermore, the supervisory block 122 may be configured to, in response to the occurrence of a leakage current determined by the apparatus 100 or 120 (or determination by the block 122 based on measurements from the apparatuses 100, 120), provide for control of the series arrangement 103 to bring the battery cells into a safe state, which typically comprises battery contactors, that connect the series arrangement to a load or a battery charge, being opened.

The detection of the occurrence of a leakage current may be important as such a leakage current may affect the measured voltage across a battery cell 101, 102, which may be used to safely control the operation of the series arrangement 103 or battery pack of which the series arrangement forms part.

The consequence of subjecting a cell, such as a Lithium-Ion cell, to an over-charge condition may comprise the formation of smoke and flames. Further, underestimating the cell voltage exposes the user to the risk of an undetected over-voltage condition. Such a condition may lead to electrode breakdown of a cell due to an over-discharge condition. Accordingly, it may be advantageous to accurately measure the voltage across each cell taking account of the possibility of leakage currents that may affect the measurement.

The apparatus 100 may be configured to identify leakage currents in one or more parts of the circuitry shown in FIG. 2, such as between the cell 101 and the cell connection terminals 106, 107, between the cell 101 and the cell balancing terminals, and within the apparatus 100.

In contrast to short circuits and open wires, which may be relatively easy to detect, voltage drops due to leakage currents may be very difficult to detect. It may be desirable for the apparatus 100 to detect the occurrence of leakage currents when the series arrangement 103 is not operated, i.e. when battery contactors are open. In one or more examples, the detection of the occurrence of leakage currents when the series arrangement 103 is in use, i.e. when battery contactors are closed may be difficult.

For example, in a battery system for a traction application, e.g. in a Battery Electric Vehicle (BEV), the battery voltage may be variable due to the presence of both a time varying battery current and the noise generated by the load, which may comprise a power inverter. In one or more examples, the provision of an apparatus 100 that provides for in use monitoring of leakage currents may be desirable, particularly due to the safety related considerations of a high voltage Li-ion battery system described above.

Some safety standards, such as the ISO 26262, require dangerous faults to be contained under prescribed limits within the FTTI (Fault Tolerant Time), which is typically in the range of 1 s to 3 s. Such containment should be performed by using safety mechanisms detecting dangerous faults occurring during operation. In response to detection of a fault, such as the detection of a leakage current, the supervisory block 122 may be configured to undertake a countermeasure, such as opening the battery contactors.

With reference to FIG. 2, in which only the apparatus 100 is shown, the apparatus 100 provides for detection of the occurrence of a leakage current (as well as cell voltage monitoring in this example) for N cells labelled Cell1, Cell2 . . . Cell N−2, Cell N−1 to Cell N. The voltage across Cell N, labelled 101, may be determined from the voltage difference between the first cell connection terminal 106 and the second cell connection terminal 107. The provision of cell balancing for Cell N, labelled 101, may be provided by the balancing connection between first cell balancing terminal 111 and second cell balancing terminal 112. In this example, the second cell connection terminal 107 is configured to provide for a connection to a point between the first and second cells 101, 102. Likewise, the second cell balancing terminal 112 provides a connection to a point between the first and second cells 101, 102. Thus, the second cell connection terminal 107 and second cell balancing terminal 112 (as well as any other terminal connecting to points between cells) may be considered to be "shared" because when paired with the first cell connection terminal and first cell balancing terminal they provide for measurement/balancing of the first cell 101 and when paired with further "third" terminals, described below, they provide for measurement/balancing of the second cell 102. Accordingly, for Cell N−1, the voltage across Cell N, labelled 102, may be determined from the voltage difference between the second cell connection terminal 107 and a third cell connection terminal 203. The third cell connection terminal for connection to the second cell terminal 105 of the second cell 102 (Cell N−1) via third filter circuitry 204. Likewise, the provision of cell balancing for Cell N−1, labelled 102, may be provided by a balancing connection provided by second balancing circuitry 209 between the second cell balancing terminal 112 and a third cell balancing terminal 205 that provides for connection to a node 206 on a connection 207 between the second cell, Cell N−1 (labelled 102) and the cell N−2 (labelled 208). In the example of FIG. 1, separate cell connection terminals and cell balancing terminals are provided for each cell of the series arrangement 103 (rather than sharing terminals as described above) that provide for connection to nodes between adjacent cells.

In one or more examples, the balancing circuitry 113 and the second balancing circuitry 209 comprises a balancing switch, such as a MOSFET. The balancing switch may be configured to selectively provide the balancing connection, e.g. a short circuit, between the respective balancing terminals in response to a cell balancing control signal. As mentioned above, the cell balancing control signal may be provided by the supervisory block 122. Driving circuitry for actuation of the balancing switches may be provided, although is not shown for clarity.

The apparatus 100 is connected to the series arrangement 103 via cell connection circuitry 210. The first filter circuitry 201, the second filter circuitry 202 and the third filter circuitry 204 and any other filter circuitry that connects the other cell connection terminals to battery cells of the series arrangement 103, form part of the cell connection circuitry 210. In this embodiment, it will be appreciated that although the cell connection circuitry 210 is external to the integrated circuit that provides the apparatus 100, a combination of the apparatus 100 and the cell connection circuitry 202 connected to the terminals 106, 107, 111, 112, 203, 205 of the apparatus 100 for the connection to a series arrangement 103 of battery cells is disclosed.

The first, second and third filter circuitry comprise low pass filters. The low pass filters provide the apparatus 100 with a voltage signal representative of the battery cell voltage in a bandwidth of interest. In one or more examples, the filter circuitry 201, 202, 204 comprises anti-aliasing low pass filters. In one or more examples, the low pass filters are each formed by a resistor-capacitor (RC) arrangement. In particular, the low pass filters may comprise a filter resistor 211 in series between the respective cell connection terminal 106, 107, 203 and the battery terminal or node 104, 108, 206 and a filter capacitor 212 connected between a terminal of the filter resistor 211 and a reference voltage 213, such as ground.

The filter resistor 211 together with filter capacitor 212 determine the cut-off frequency of the low pass filter 201, 202, 204. In one or more examples, the low pass filters may provide a cut-off frequency of less than 200 Hz, or less than 150 Hz, or less than 120 Hz or about 112 Hz. It will be appreciated that the cut off frequency may be dependent on the load or supply connected to the series arrangement 103 or other factors. In summary, each cell connection terminal of the apparatus 100 may connect to a respective terminal of a respective battery cell via a low pass filter.

In one or more examples, the cell connection circuitry 210 comprises a first balancing resistor 214 (labelled $R_{BAL}$) for control of current through the cell balancing connection. The first balancing resistor 214 is provided in the connection between the first cell balancing terminal 111 and the first cell terminal 104 of the first cell 101. The cell connection circuitry 210, in one or more examples, comprises a second balancing resistor 215 (labelled $R_{BAL\_C}$) for control of current through the cell balancing connection, the second balancing resistor 215 is provided in the connection between the second cell balancing terminal 112 and the second node 108. The values of the balancing resistors 214, 215 may be any required value depending on the required cell balance current when the balancing connection is closed as well as the maximum allowed current. In summary, each cell balancing terminal may connect to a respective terminal of a respective battery cell via a cell balancing resistor while bypassing the filter circuitry. The balancing resistors labelled $R_{BAL}$ and $R_{BAL\_C}$ may have different resistance values. In one or more examples, each cell 101, 102 may have one cell balancing connection through a balancing resistor having a first resistance and have the other cell balancing connection through a balancing resistor of a different, second resistance.

In one or more examples, the cell connection circuitry 210 includes electrostatic discharge protection circuitry in both the cell balancing connections (those that extend from the cell balancing terminals) and cell connections (those that extend from the cell connection terminals) at an end that connects to the battery terminals 104, 105. In particular, in one or more examples, the electrostatic discharge protection circuitry comprises a first capacitor 216 (labelled $C_{HF}$) connected between one of the respective battery terminals 104, 105 and a reference voltage, such as ground 218. A second capacitor 217 (labelled $C_{HF}$) is connected to the node 108 between the second terminal 105 of the first cell 101 and the first terminal 104 of the second cell 102 and a reference voltage, such as ground 219. In one or more examples, the electrostatic discharge protection circuitry may not be present.

In one or more examples, the cell connection circuitry 210 may include a differential filtering capacitor 220 between each consecutive pair of the cell connection terminals 106 and 107; 107 and 203 associated with each cell 101, 102. In one or more examples, the differential filtering capacitors 220 may not be present.

In one or more examples, each cell connection terminal may connect to an, in series, a hot plug resistor 221 configured to provide for resistance against the effects of making a connection at the cell connection terminals while the cell connection circuitry 210 is connected to the series arrangement 103 of battery cells. In one or more examples, the hot plug resistors 221 may not be present.

It will be appreciated that, in one or more examples, for each battery cell 101, 102 of the series arrangement 103, a pair of cell connection terminals is provided, with associated low pass filter circuitry, for connection to the respective pair of terminals of said battery cell. Likewise, in one or more examples, a pair of cell balancing terminals is provided, bypassing said low pass filter circuitry and each for connection to the respective pair of terminals of said battery cell, via a balancing resistor.

In one or more examples, the pair of cell balancing electrodes that connect to the respective pair of terminals of each cell and bypass the filter circuitry may not perform a cell balancing function. Instead, for example, they may be provided for measurement of an unfiltered voltage across the battery cell terminals (i.e. unfiltered in respect of the filter circuitry 201, 202, 204) for the dedicated purpose of identifying the occurrence of a leakage current. In such an instance, they may be referred to as unfiltered cell connection terminals.

In one or more examples, the cell balancing terminals 111, 112, 205 may each be connected to a balancing capacitor (only one of which is labelled 222 in FIG. 2 for clarity), which in combination with the respective balancing resistors 214, 215 form balancing filter circuitry. The balancing capacitor 222 is connected in parallel with the respective balancing resistor between the balancing resistor and a reference voltage, such as ground. The balancing capacitors 222 labelled $C_B$ and $C_{BC}$ in FIG. 3 may have different capacitance values. In one or more examples, each cell 101, 102 may have one cell balancing connection that connects to one of the balancing capacitors having a first capacitance and have the other cell balancing connection that connects to one of the balancing capacitors of a different, second capacitance. In one or more examples, for each cell, the resistance/capacitances may be provided such that $C_B \cdot R_{BAL} = C_{BC} \cdot R_{BAL\_C}$.

Figure 3:
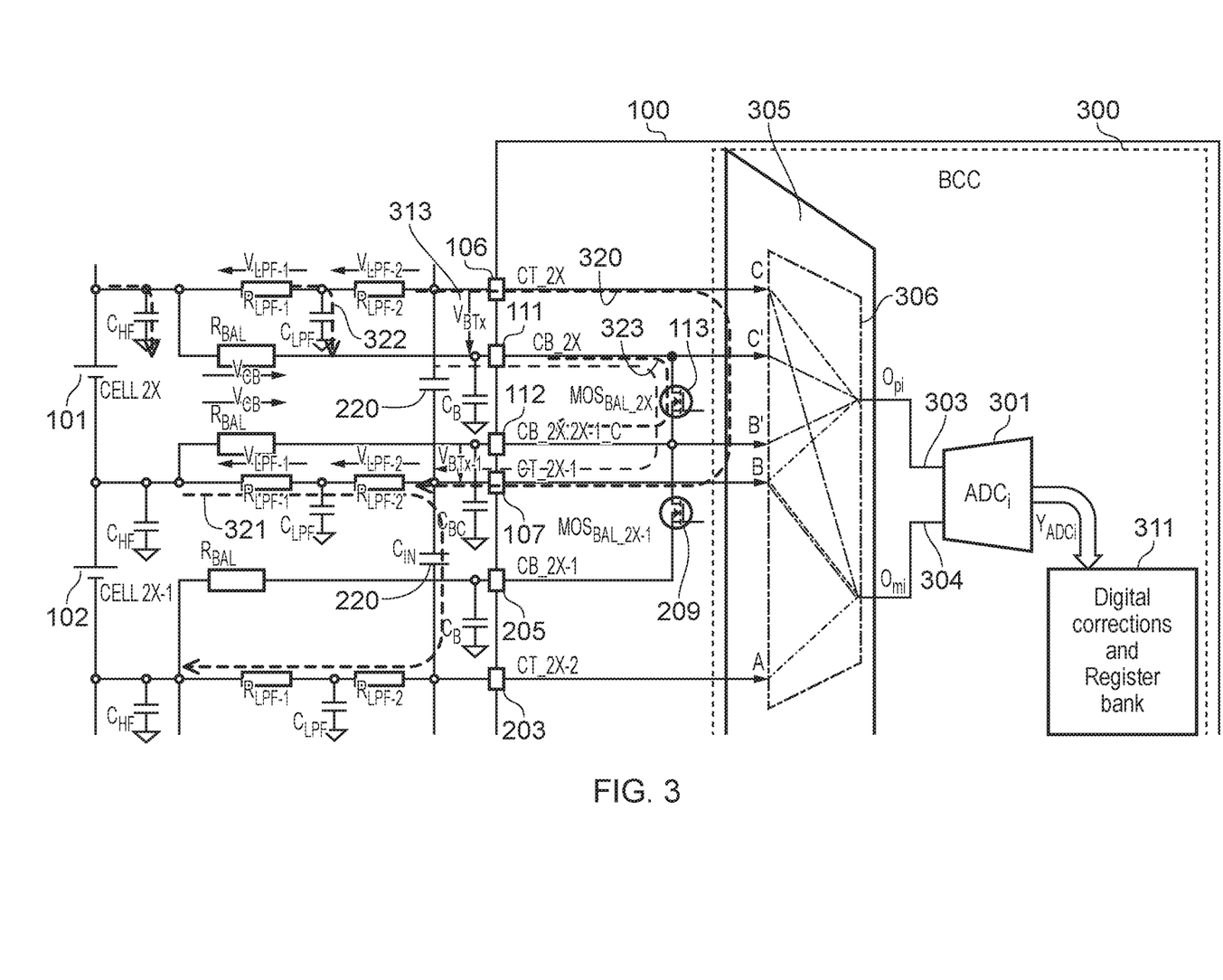
FIG. 3 shows a more detailed view of the apparatus of FIG. 2, including possible leakage paths.

FIG. 3 shows example internal details of the apparatus 100 and, in particular, the difference determination circuitry 300. The calculation of the voltage differences between cell connection terminals and the cell balancing terminals may be performed in any suitable manner and the circuitry described here is an example of such a manner.

In one or more examples, the difference determination circuitry comprises at least one differential analogue to digital converter 301, 302 (two shown in FIG. 3), each having a positive terminal 303 and a negative terminal 304. The positive and negative terminals 303, 304 are, in this example, configured to sequentially be connected to the respective ones of the cell connection terminals and cell balancing terminals to determine the required voltage differences. Thus, as an example, the positive terminal 303 of the differential analogue to digital converter 301 is connectable to at least the first cell connection terminal 106 and the negative terminal 304 is connectable to at least the first cell balancing terminal 111, to determine a voltage difference therebetween.

The selective connection of the cell connection terminals 106, 107, 203 and cell balancing terminals 111, 112, 205 to the differential analogue to digital converter (ADC) 301 (and 302) may be provided by a cross connect network 305. The cross connect network 305 may comprise a structured multiplexer, which routes differential input lines to differential output lines, where the number of pairs of input lines is greater than the number of pairs of output lines. This cross connect network 305 may include level-shifting functionality to account for cell terminals at higher potentials in the series arrangement. In one or more examples, the structured multiplexer 305 may be made of a plurality of component multiplexers 306. One of the component multiplexers 306 is represented in dashed-dotted line serving the connections required for battery cells 101, 102 (labelled Cell 2X and Cell 2X−1). A further component multiplexer may be provided to serve the connections required for battery cells 307, 308 (labelled Cell 2X−2 and Cell 2X−3). The cross connect network 305 may provide for sequentially forming connections between the positive terminal 303 of the differential analogue to digital converter 301 and at least two of the first cell connection terminal 106; the second cell connection terminal 107; the third cell connection terminal 203; the first cell balancing terminal 111; the second cell balancing terminal 112; and the third cell balancing connection 205 and also configured to sequentially form connections between the negative terminal 304 of the differential analogue to digital converter and at least two of the first cell connection terminal 106; the second cell connection terminal 107; the third cell connection terminal 203; the first cell balancing terminal 111; and the second cell balancing terminal 112. It will be appreciated that the cross connect network 305 and in particular component multiplexer 306 of the present example is shown to provide connections associated with the battery cells 101 and 102 and therefore, if it is configured to serve a greater number of battery cells the terminals from which it forms connections will be correspondingly increased. Thus, in summary, the cross connect network 306 provides for sequential connection, under the control of a controller 310, of pairs of the terminals, connected to a group of the battery cells, for determination of the voltage differences between said terminals, which, in this example, is performed by the differential ADCs 301, 302.

In one or more examples, the difference determination circuitry 300 includes a calculation block 311 configured to receive signalling from the differential analogue to digital converters 301, 302 representative of voltage difference measurements and is configured to determine a further difference between the voltage differences measured between. In particular, it may be configured to determine the difference between:

i) the voltage difference between the first cell connection terminal 106 and the first cell balancing terminal 111; and
ii) the voltage difference between the second cell connection terminal 107 and the second cell balancing terminal 112.

A corresponding calculation may be performed for each battery cell 101, 102, 307, 308 of the series arrangement 103. In general, the calculation block is configured to determine A-B for each cell, where A is the difference between a low-pass-filtered voltage and an unfiltered voltage level from a first terminal of the battery cell and B is the difference between a low-pass-filtered voltage and an unfiltered voltage level from a second terminal of said same battery cell.

In one or more examples the calculation block is configured to remove a voltage offset component from the signalling received from the differential analogue to digital converter.

In one or more examples the calculation block is configured to modify said signalling received from the differential analogue to digital converter based on a predetermined gain correction value.

The calculation block 311 may be configured to store the calculated values for determination of the occurrence of a leakage current in a register (not shown).

The apparatus 100 may include a transceiver 312 configured to pass said the calculated values or a notification of the identification of a leakage current to the supervisory block 122 external to the apparatus 100.

The controller 310 may comprise a logic core configured to perform one or more of governing of the addressing of the multiplexer(s) 306, controlling the differential ADC 301, 302 timing and sequencing, controlling the data post-processing by the calculation block 311, controlling the data transfer from the calculation block for storage of calculated values, and communication of measurement results (including one or more of frame assembling and disassembling, command interpretation) for the transceiver 312.

Turning to the operation of the apparatus 100 in determining the occurrence of a leakage current, as well as monitoring of the voltage across the plurality of battery cells and providing balancing connections where required.

With reference to FIG. 3 and a taking a consecutive pair of cells 101 and 102 as an example, labelled Cell 2X and Cell 2X−1, the cross connect network 306 may be configured to provide for at least the following four connection modes for each cell:

1. Connect the first cell connection terminal 106 and the second cell connection terminal 107 to the output of the network 306 for application to ADC 301. This mode provides the connections to measure the voltage across the first cell 101, labelled Cell 2X.
2. Connect the second cell connection terminal 107 and the third cell connection terminal 203 to the output of the network 306 for application to ADC 301. This mode provides the connection to measure the voltage across the second cell 102, labelled Cell 2X−1.
3. Connect the first cell balancing terminal 111 and first cell connection terminal 106 to the output of the network for application to the positive terminal 303 and negative terminal 304 respectively of the ADC 301 to measure the voltage drop across terminals 111 and 106. This mode provides a diagnostic connection for, in part, determining the occurrence of a current leakage.
4. Connect the second cell balancing terminal 112 and the second cell connection terminal 107 to the output of the network for application to the positive terminal 303 and negative terminal 304 respectively of the ADC 301 to measure the voltage drop across terminals 112 and 107. This mode provides a diagnostic connection for, in part, determining the occurrence of a current leakage.

Thus, in modes 1 and 2, the apparatus 100 is configured to provide for battery cell voltage monitoring for cells 101 and 102 respectively based on voltages measured from the respective cell connection terminals.

It will be appreciated that for the pair of cells 101, 102 (labelled Cell 2X and Cell 2X−1), the following voltage can be measured:

$$V_{BT} = V_{LPF-1} + V_{LPF-2} + V_{CB} \qquad (1)$$

Where $V_{BT}$ (labelled 313 in FIG. 3) is the voltage difference measured in modes 3 and 4 above, $V_{LPF-1}$ is the voltage drop across filter resistor 211 (labelled $R_{LPF-1}$), $V_{LPF-2}$ is the voltage drop across hot plug resistor 221 (labelled $R_{LPF-2}$) and $V_{CB}$ is the voltage drop across the balancing resistor 214 (labelled $R_{BAL}$) for an even numbered cell, i.e. CELL 2X, or the voltage drop across the balancing resistor 215 (labelled $R_{BAL\_C}$) for an odd numbered cell, CELL 2X−1.

Looking now at possible leakage conditions for DC signals we consider the following cases;

i) a leakage current 320 between the first cell connection terminal 106 and the second cell connection terminal 107 termed an "Internal differential leakage current": this current leakage is detectable and if it was not detected it may be dangerous, since abnormal voltage drops across filter resistor 211 and hot plug resistor 221 (labelled $R_{LPF-1}$ and $R_{LPF-2}$) imply a voltage error given by $2(R_{LPF-1} + R_{LPF-2}) \cdot I_{leak}$, where $I_{leak}$ is the leakage current;

ii) a leakage current 321 (shown in relation to the second cell rather than the first for clarity) through the differential filtering capacitor 220 connected between the first/second cell connection terminal 106/107 and the second/third cell connection terminal 107/203 respectively termed "External leakage differential current": this fault is detectable and, if not detected, may be dangerous, since an abnormal voltage drop across filter resistor 211 and hot plug resistor 221 (labelled $R_{LPF-1}$ and $R_{LPF-2}$) imply a voltage error given by $2(R_{LPF-1} + R_{LPF-2}) \cdot I_{leak}$, where $I_{leak}$ is the leakage current;

iii) a leakage current 322 through the first filter circuitry 201 or second filter circuitry 202 to ground 213 for example termed an "External unipolar leakage current": this fault is detectable and, if not detected, may be dangerous, since abnormal voltage drops across filter resistor 211 (labelled $R_{LPF-1}$) implies a voltage error given by $R_{LPF-1} \cdot I_{leak}$, where $I_{leak}$ is the leakage current;

iv) a leakage current 323 through the balancing circuitry 113 when said circuitry 113 is open and thereby not providing said cell balancing connection termed an "Internal cell balance leakage current": this fault is detectable and, if not detected, it may be dangerous in the presence of a parasitic resistance of the connector (not shown), which may create an abnormal voltage drop. However, this is detectable, since there will be a voltage drop across balancing resistors 214, 215 (labelled $R_{BAL}$ and $R_{BAL\_C}$).

Thus, in consideration of DC signals, the above-mentioned leakage currents may be detected. However, when the series arrangement 103 of battery cells is being operated, such as when providing power to a load, the voltage signals measured above are not pure DC signals. It can be considered that the voltage across a given battery cell 101, 102 is given by the electromotive force due to electrochemical reactions, plus a term depending on the battery cell internal impedance, which may be proportional to the current flowing through the cell. The battery current may have a highly time variable behaviour and may contain noise. While the voltage signal across the hot plug resistor 221 (labelled $V_{LPF\text{-}2}$) may be well filtered by the presence of filter circuitry 201, the voltage signal across the filter resistor 211 (labelled $V_{LPF\text{-}1}$) is unfiltered and not low-pass. This may create problems for the accurate determination of leakage currents. The apparatus 100 may be configured to provide for identification of a leakage current during charging or discharging of the electrochemical battery cells of the series arrangement.

Figure 4:
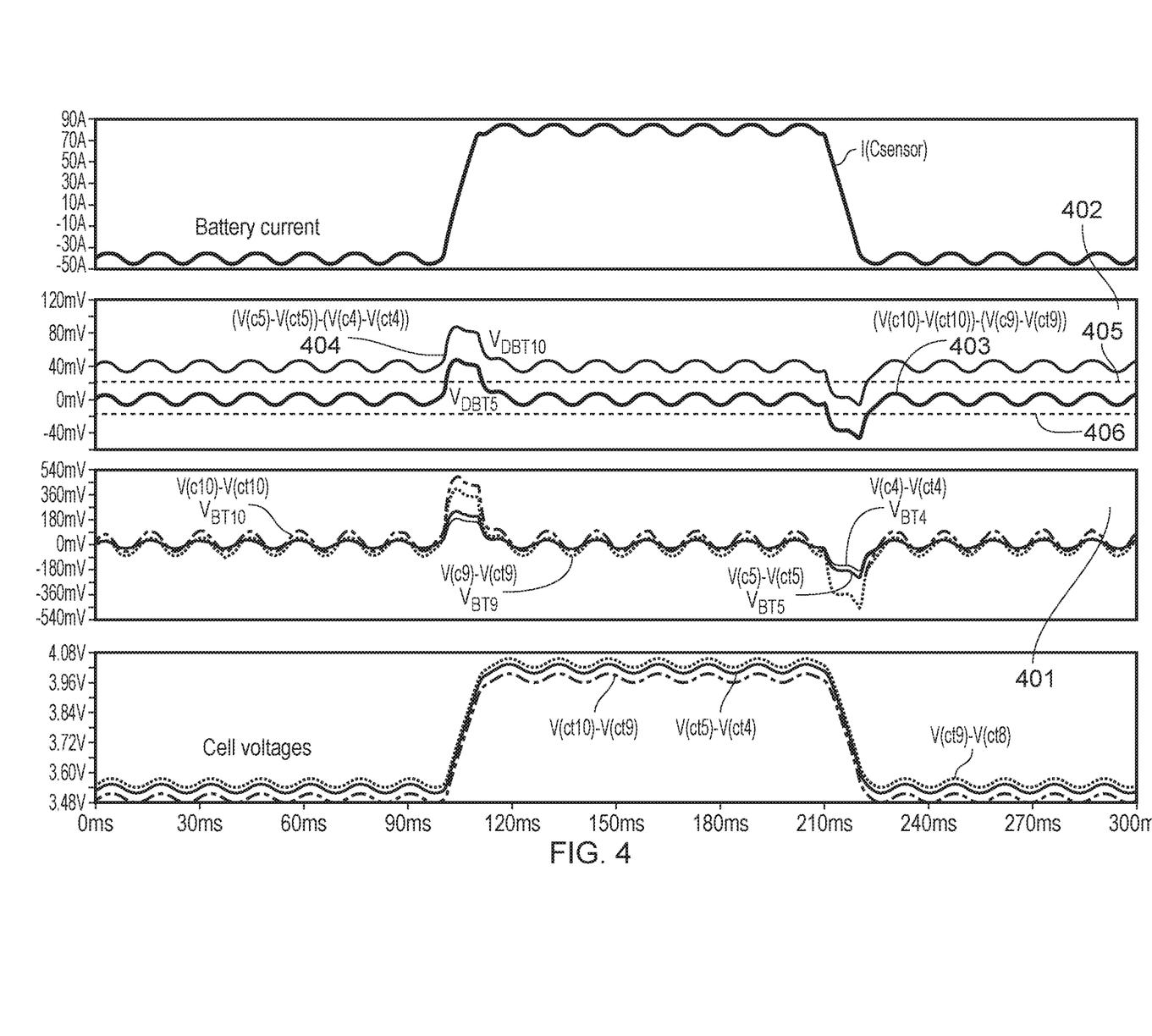
FIG. 4 shows a plurality of example graphs showing the measured voltage signals while the series arrangement of battery cells is in use.

Turning to FIG. 4, graph 401 shows the value of $V_{BTX}$ comprising the value $V_{BT}$ of equation 1 above for the battery cell X. FIG. 4 shows a situation in which cell X=10 is affected by an abnormal 4 μA leakage current flowing through its cell connection terminals, that is leakage condition (i) mentioned above. Further, FIG. 4 shows a situation in which cell X=5 has a normal (i.e. expected given the specification of the circuitry) leakage that is less than 100 nA leakage current flowing through its cell connection terminals. The ripple generated by current fluctuations on the signals makes it difficult to extract the very small voltage offset due to the leakage current.

However, the difference determination circuitry 300 is configured to determine the leak detection voltage difference for one or more of the battery cells that is described above and as denoted in equation form in equation 2 below. The leak detection voltage difference may be considered a form of redundant filtering.

$$V_{DBTx} = V_{BTx} - V_{BTx-1} \quad (x = 1 \ldots N) \quad (2)$$

Graph 402 of FIG. 4 shows the time evolution of the leak detection voltage difference for Cell 5, $V_{DBT5}$, labelled 403, according to equation 2, which is related to the normally operating cell X=5. Graph 402 also shows the time evolution of the leak detection voltage difference for Cell 10, $V_{DBT10}$, labelled 404, according to equation 2, which is related to the abnormally operating cell X=10, that is experiencing a leakage current. It is visible that most of the ripple fluctuation is removed, and the apparatus 100 may be configured to use a predefined threshold range, $V_{th}$, 405, 406 in order to detect the leakage. Thus, the apparatus 100 or supervisory block 122 may be configured to detect the occurrence of a leakage current based on a determination that the leak detection voltage difference is outside a predetermined threshold range or a magnitude of the leak detection voltage difference is greater than a predetermined threshold, i.e. $|V_{DBTX}| > V_{th}$.

In one or more examples, the difference determined by equation 2 may be filtered in accordance with a discrete time process with a predetermined period $T_s$. In one or more examples $T_s$ may be in the range of 1 to 100 ms.

In one or more examples, the detection of the occurrence of a leakage current may be configured to be limited to time periods outside a predetermined time window around when the series arrangement of battery cells is connected to or disconnected from a load.

The discrete time process may be implemented by the following pseudo-code:

```
For x = 1 to N
    V_DBTfilt x = MA_N(V_DBT x) // moving average
    If (|V_DBTfilt x| > V_th) Then
        Leakage_fault x = TRUE
    Else If If (|V_DBTfilt x| < V_th - V_hysteresis)
        Leakage_fault x = FALSE
End For
```

At time 0, it is: Leakage_fault$_x$=FALSE, for any x.

The operator $MA_N(\bullet)$ is a moving average of length N which gets updated every time a new measurement is available.

Thus, the apparatus 100 or supervisory block 122 may provide for identification of leakage current based on a discrete time filtered leak detection voltage difference comprising the leak detection voltage difference subjected to discrete time filtering exceeding a predetermined threshold Vth.

In one or more embodiments, the leak detection voltage difference $V_{DBTX}$ of equation 2 is determined over a sliding time window and that value is compared to a threshold (i.e. exceeding a single threshold or passing outside a threshold range). For example, the sliding window may comprise the last M measurements taken, where M=10 to 100, although other values within or outside this range are possible.

In one or more examples, the supervisory block 122 forms part of the apparatus 100 and the supervisory block is configured to, in response to said identification of a leakage current, provide for disconnection of the series arrangement from one or more of:

a load powered by said series arrangement; and a charger configured to charge said electrochemical cells of the series arrangement 103.

Figure 5:
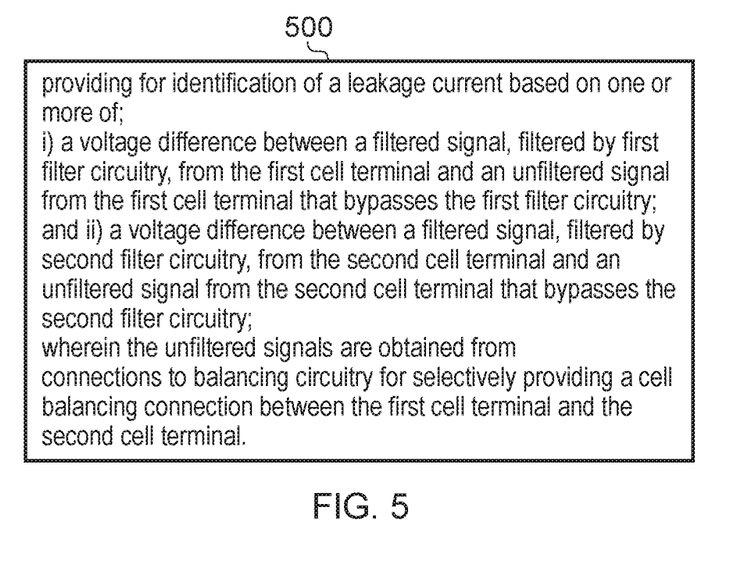
FIG. 5 illustrates an example method.

FIG. 5 shows a flowchart illustrating the step 500 of providing for determination of an occurrence of a leakage current between a plurality of electrochemical battery cells connected in a series arrangement, each cell having a first cell terminal and a second cell terminal, wherein the method comprises;

providing for identification of a leakage current based on one or more of;
  i) a voltage difference between a filtered signal, filtered by first filter circuitry, from the first cell terminal and an unfiltered signal from the first cell terminal that bypasses the first filter circuitry; and
  ii) a voltage difference between a filtered signal, filtered by second filter circuitry, from the second cell terminal and an unfiltered signal from the second cell terminal that bypasses the second filter circuitry;
wherein the unfiltered signals are obtained from connections to balancing circuitry for selectively providing a cell balancing connection between the first cell terminal and the second cell terminal.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

Figure 6:
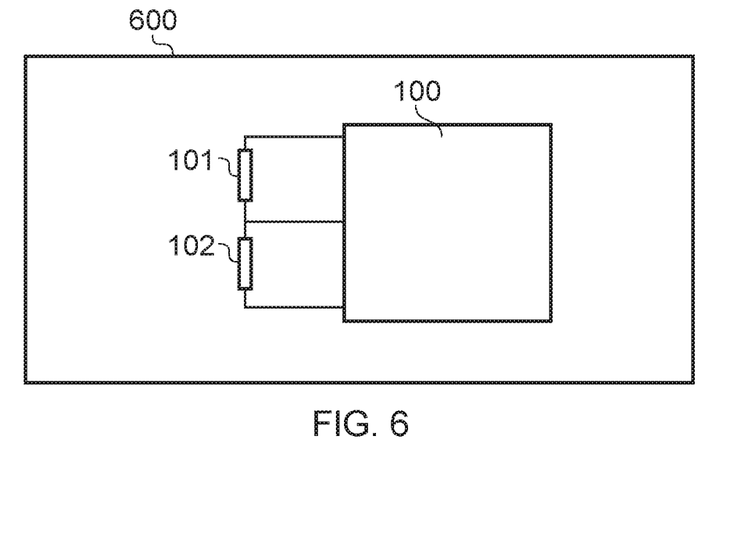
FIG. 6 shows a battery pack, for an electric vehicle for example, comprising a plurality of electrochemical battery cells and the apparatus.

FIG. 6 shows a battery pack 600 comprising a plurality of electrochemical battery cells 101, 102 and including the apparatus 100 described above, the electrochemical battery cells arranged in the series arrangement 103 and comprising at least the first cell 101 and the second cell 102. The battery pack may form part of a battery electric vehicle.

It will be appreciated that while a battery pack may comprise a plurality of battery cells connected in series and as described above and as illustrated in the figures, each individual cell may, itself, be made up of a plurality of elementary cells connected in parallel.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed:

1. An apparatus for determining the occurrence of a leakage current between a plurality of electrochemical battery cells connected in a series arrangement, each cell having a first cell terminal and a second cell terminal, wherein the apparatus comprises:
    a first cell connection terminal for connection to the first cell terminal of a first cell via first filter circuitry;
    a second cell connection terminal for connection, via second filter circuitry, to a first node on a connection between a second cell terminal of the first cell and a first cell terminal of a second cell, the first cell and the second cell adjacent to one another in the series arrangement;
    a first cell balancing terminal for connection to the first cell terminal of the first cell and bypassing the first filter circuitry;
    a second cell balancing terminal for connection to a second node on the connection between the second cell terminal of the first cell and the first cell terminal of the second cell, the first and second cell balancing terminals adjacent to one another in the series arrangement;
    balancing circuitry for selectively providing a cell balancing connection between the first cell balancing terminal and the second cell balancing terminal;
    the apparatus configured to provide for identification of a leakage current based at least on a voltage difference between one or more of;
        i) the first cell connection terminal and the first cell balancing terminal; and
        ii) the second cell connection terminal and the second cell balancing terminal.

2. The apparatus according to claim 1, in which the apparatus includes difference determination circuitry configured to provide for identification of the leakage current based at least on a leak detection voltage difference comprising the difference between the voltages measured between;
    i) the first cell connection terminal and the first cell balancing terminal; and
    ii) the second cell connection terminal and the second cell balancing terminal.

3. The apparatus according to claim 2, wherein the apparatus provides for identification of leakage current based on a filtered leak detection voltage difference and based on a predetermined threshold, the filtered leak detection voltage difference comprising the leak detection voltage difference subjected to discrete-time filtering.

4. The apparatus according to claim 2, in which the difference determination circuitry is provided by a differential analogue to digital converter having a positive terminal and a negative terminal, the positive terminal connectable to at least the first cell connection terminal and the negative terminal connectable to at least the first cell balancing terminal.

5. The apparatus according to claim 4, in which the difference determination circuitry includes a cross connect network;
    configured to sequentially form connections between the positive terminal of the differential analogue to digital converter and at least two of the first cell connection terminal; the second cell connection terminal; the first cell balancing terminal and the second cell balancing terminal; and
    configured to sequentially form connections between the negative terminal of the differential analogue to digital converter and at least two of the first cell connection terminal; the second cell connection terminal; the first cell balancing terminal and the second cell balancing terminal.

6. The apparatus according to claim 4, in which the difference determination circuitry includes a calculation block configured to receive signalling from the differential analogue to digital converter representative of voltage difference measurements and determine the difference between the voltages measured between;
 i) the first cell connection terminal and the first cell balancing terminal; and
 ii) the second cell connection terminal and the second cell balancing terminal.

7. The apparatus of claim 1, in which the apparatus includes a transceiver configured to pass said identification of a leakage current to a supervisory block external to the apparatus.

8. The apparatus of claim 1 in which the leakage current comprises one or more of:
 i) a leakage current between the first cell connection terminal and the second cell connection terminal;
 ii) a leakage current through a differential filtering capacitor connected between the first cell connection terminal and the second cell connection terminal;
 iii) a leakage current through the first filter circuitry or second filter circuitry;
 iv) a leakage current through the balancing circuitry when said circuitry is open and thereby not providing said cell balancing connection.

9. The apparatus of claim 1 in which the apparatus is configured to provide for cell voltage monitoring based on voltages measured from the first cell connection terminal and the second cell connection terminal.

10. The apparatus accordingly to claim 1, in which the apparatus configured to provide for identification of a leakage current during charging or discharging of the electrochemical battery cells of the series arrangement.

11. The apparatus according to claim 1, in which the first filter circuitry and the second filter circuitry comprise low pass filters.

12. The apparatus of claim 1 in combination with cell connection circuitry, the cell connection circuitry including the first filter circuitry and the second filter circuitry.

13. The apparatus of claim 12, in which the cell connection circuitry includes one or more of;
 i) a first balancing resistor ($R_{BAL}$) for control of current through the cell balancing connection, the first balancing resistor provided in the connection between the first cell balancing terminal and the first cell terminal of the first cell; and
 ii) a second balancing resistor ($R_{BAL\_C}$) for control of current through the cell balancing connection, the second balancing resistor provided in the connection between the second cell balancing terminal and the second node.

14. An apparatus comprising:
a plurality of electrochemical battery cells connected in a series arrangement, each cell having a first cell terminal and a second cell terminal;
a first cell balancing terminal adjacent to the first cell terminal in the series arrangement;
a second cell balancing terminal adjacent to the first balancing terminal in the series arrangement;
difference determination circuitry configured to determine leakage current based on:
 i) a voltage difference between a filtered signal, filtered by first filter circuitry, from the first cell terminal and an unfiltered signal from the first cell terminal that bypasses the first filter circuitry from the first cell balancing terminal; and
 ii) a voltage difference between a filtered signal, filtered by second filter circuitry, from the second cell terminal and an unfiltered signal from the second cell terminal that bypasses the second filter circuitry from the second balancing terminal;
wherein the unfiltered signals are obtained from connections to balancing circuitry to selectively provide a cell balancing connection between the first cell terminal and the second cell terminal.

15. The apparatus according to claim 14, in which the difference determination circuitry includes a differential analogue to digital converter having a positive terminal and a negative terminal, the positive terminal connectable to at least the first cell terminal and the negative terminal connectable to at least a first cell balancing terminal.

16. The apparatus according to claim 15, in which the difference determination circuitry includes a cross connect network;
 configured to sequentially form connections between the positive terminal of the differential analogue to digital converter and at least two of: the first cell terminal, the second cell terminal, the first cell balancing terminal, and the second cell balancing terminal; and
 configured to sequentially form connections between the negative terminal of the differential analogue to digital converter and at least two of: the first cell terminal, the second cell terminal, the first cell balancing terminal, and the second cell balancing terminal.

17. The apparatus according to claim 15, in which the difference determination circuitry includes a calculation circuit configured to receive signals from the differential analogue to digital converter representative of voltage difference measurements and determine the difference between the voltages measured between;
 i) the first cell terminal and the first cell balancing terminal; and
 ii) the second cell terminal and the second cell balancing terminal.

18. The apparatus of claim 14, in which the apparatus includes a transceiver configured to pass identification of leakage current to a supervisory block external to the apparatus.

19. The apparatus of claim 14 in which the leakage current comprises one or more of:
 i) a leakage current between the first cell terminal and the second cell terminal;
 ii) a leakage current through a differential filtering capacitor connected between the first cell terminal and the second cell terminal;
 iii) a leakage current through the first filter circuitry or second filter circuitry;
 iv) a leakage current through the balancing circuitry when said circuitry is open and thereby not providing said cell balancing connection.

20. The apparatus of claim 14 in which the apparatus is configured to monitor cell voltage based on voltages measured from the first cell terminal and the second cell terminal.

* * * * *